US010559556B2

(12) United States Patent
Leirer et al.

(10) Patent No.: US 10,559,556 B2
(45) Date of Patent: Feb. 11, 2020

(54) OPTOELECTRONIC SEMICONDUCTOR COMPONENT

(71) Applicant: OSRAM Opto Semiconductors GmbH, Regensburg (DE)

(72) Inventors: Christian Leirer, Friedberg (DE); Korbinian Perzlmaier, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/741,731

(22) PCT Filed: Jul. 4, 2016

(86) PCT No.: PCT/EP2016/065714
§ 371 (c)(1),
(2) Date: Jan. 3, 2018

(87) PCT Pub. No.: WO2017/009085
PCT Pub. Date: Jan. 19, 2017

(65) Prior Publication Data
US 2018/0197843 A1    Jul. 12, 2018

(30) Foreign Application Priority Data

Jul. 15, 2015 (DE) .................. 10 2015 111 485

(51) Int. Cl.
*H01L 25/16* (2006.01)
*H01L 27/15* (2006.01)
(Continued)

(52) U.S. Cl.
CPC ............ *H01L 25/167* (2013.01); *H01L 27/15* (2013.01); *H01L 33/382* (2013.01); *H01L 33/486* (2013.01); *H01L 33/62* (2013.01)

(58) Field of Classification Search
CPC ............ H01L 27/0248; H01L 27/0251; H01L 27/0255; H01L 27/0292; H01L 27/0296
See application file for complete search history.

(56) References Cited

U.S. PATENT DOCUMENTS 7,897,497 B2    3/2011   Kamii et al.
2005/0168899 A1 8/2005   Sato et al.
(Continued)

FOREIGN PATENT DOCUMENTS

CN    102110760 A    6/2011
CN    102687271 A    9/2012
(Continued)

OTHER PUBLICATIONS

English Translation of PCT/EP2016/065714 (Year: 2016).*
(Continued)

*Primary Examiner* — Vincent Wall
(74) *Attorney, Agent, or Firm* — McDermott Will & Emery LLP

(57) ABSTRACT

An optoelectronic semiconductor component is disclosed, comprising: a semiconductor body (1) having a semiconductor layer sequence (2) with a p-type semiconductor region (3), an n-type semiconductor region (5), and an active layer (4) arranged between the p-type semiconductor region (3) and the n-type semiconductor region (5); a support (10) having a plastic material and a first via (11) and a second via (12); a p-contact layer (7) and an n-contact layer (8), at least some regions of which are arranged between the support (10) and the semiconductor body (1), wherein the p-contact layer (7) connects the first via (11) to the p-type semiconductor region (3) and the n-contact layer (8, 8A) connects the second via (12) to the n-type semiconductor region (5); and an ESD protection element (15) which is arranged between the support (10) and the semiconductor body (1), wherein the ESD protection element (15) is electrically
(Continued)

Figure 3:
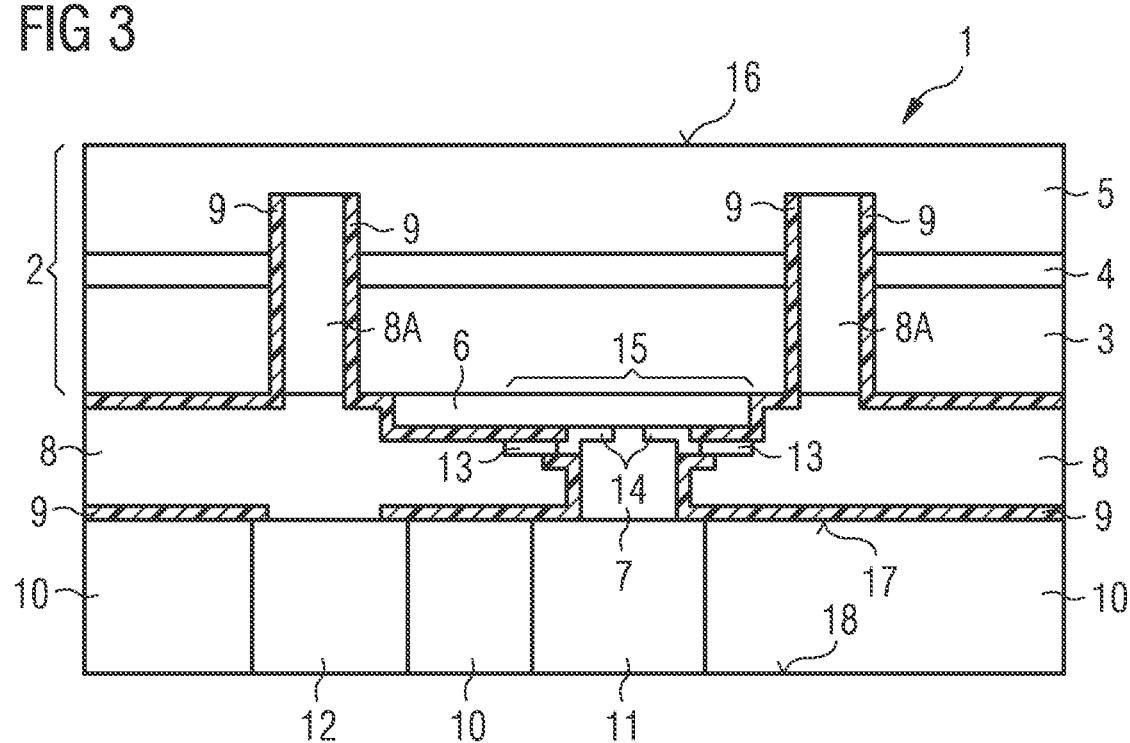

conductively connected to the first via (11) and to the second via (12), and wherein a forward direction of the ESD protection element (15) is anti-parallel to a forward direction of the semiconductor layer sequence (2).

9 Claims, 2 Drawing Sheets

(51) Int. Cl.
  H01L 33/38  (2010.01)
  H01L 33/48  (2010.01)
  H01L 33/62  (2010.01)

(56) References Cited

U.S. PATENT DOCUMENTS

| | | |
|---|---|---|
| 2006/0060880 A1 | 3/2006 | Lee et al. |
| 2007/0284606 A1 | 12/2007 | Sugimori |
| 2009/0201042 A1 | 8/2009 | Sellathamby et al. |
| 2011/0147466 A1 | 6/2011 | Kang et al. |
| 2011/0180831 A1 | 7/2011 | Song |
| 2011/0260210 A1 | 10/2011 | Su |
| 2011/0291148 A1 | 12/2011 | Sugizaki et al. |
| 2012/0206048 A1* | 8/2012 | Yang ............... H05B 33/089 315/122 |
| 2013/0020598 A1 | 1/2013 | Yang et al. |
| 2013/0207154 A1* | 8/2013 | Hoppel ............. H01L 25/167 257/99 |
| 2015/0084080 A1* | 3/2015 | Kawakita ........... H01L 25/167 257/98 |
| 2015/0097208 A1 | 4/2015 | Sugizaki et al. |
| 2015/0179629 A1 | 6/2015 | Ko et al. |
| 2015/0364665 A1 | 12/2015 | Lopez |
| 2016/0005941 A1 | 1/2016 | Tsai et al. |

FOREIGN PATENT DOCUMENTS

| | | | |
|---|---|---|---|
| CN | 103003941 A | | 3/2013 |
| CN | 104094427 A | | 10/2014 |
| DE | 102008022942 A1 | | 11/2009 |
| DE | 102008034560 A1 | | 2/2010 |
| DE | 102009032486 A1 | | 1/2011 |
| DE | 102009053064 A1 | | 5/2011 |
| DE | 102010027679 A1 | | 1/2012 |
| DE | 102012105619 A1 | | 1/2014 |
| DE | 102012106364 A1 | | 1/2014 |
| DE | 102012108627 A1 | * | 3/2014 |
| DE | 102013110853 A1 | | 4/2015 |
| DE | 102013112881 A1 | | 5/2015 |
| DE | 102014112673 A1 | | 3/2016 |
| EP | 2402995 A2 | | 1/2012 |
| JP | S5879746 A | | 5/1983 |
| JP | H05110073 A | | 4/1993 |
| JP | 2001203428 A | | 7/2001 |
| JP | 2012138499 A | | 7/2012 |
| JP | 2013122951 A | | 6/2013 |
| JP | 2015092547 A | | 5/2015 |
| WO | 2013121787 A1 | | 2/2015 |
| WO | 2015049079 A1 | | 4/2015 |
| WO | 2013187318 A1 | | 2/2016 |

OTHER PUBLICATIONS http://www.learnabout-electronics.org/Semiconductors/diodes_24.php (Year: 2018).*
EPO bib sheet for DE-102012108627-A1 showing that US 20150249073 A1 is the US counterpart to the German publication. (Year: 2014).*
Notice of Reason for Rejection of Japanese Application No. 2017568302, dated Dec. 7, 2018 with English translation.
Pankove, J. I.: "Hydrogenated Amorphous Silicon: Device applications" Academic Press, 1984, p. 122.
Street, R. A.: "Technology and Applications of Amorphous Silicon" Street, R. A. (Ed.), Springer Science & Business Media, Nov. 2, 1999, pp. 60-61.
English Translation of Examination Report received in Chinese Patent Application No. 201680040359.9, dated Sep. 29, 2019.

* cited by examiner

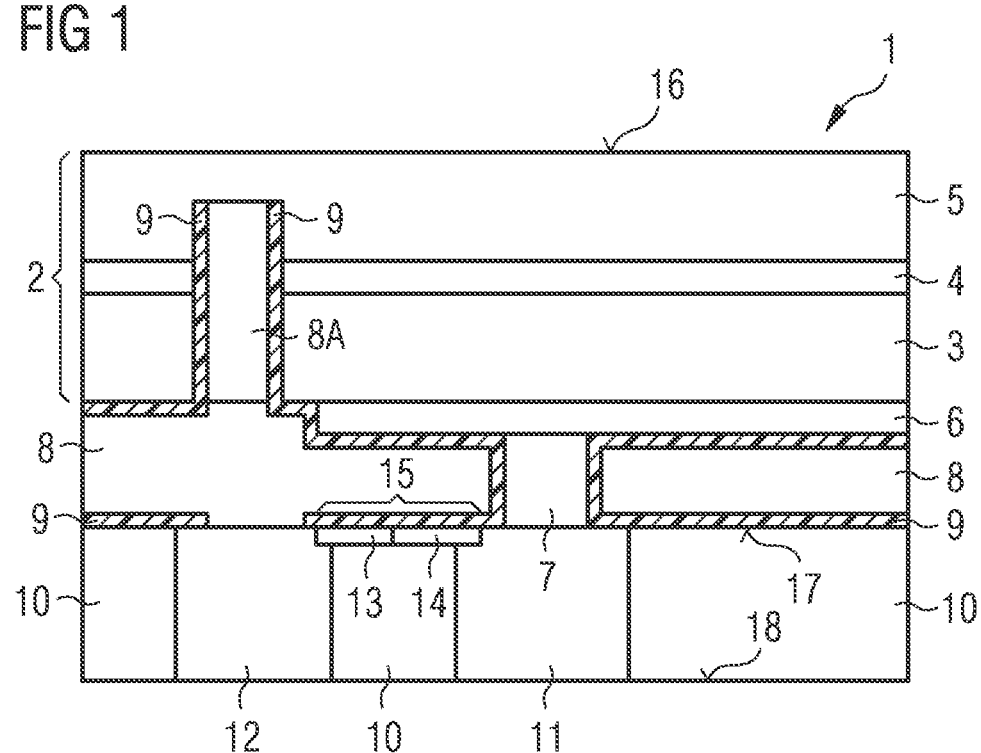
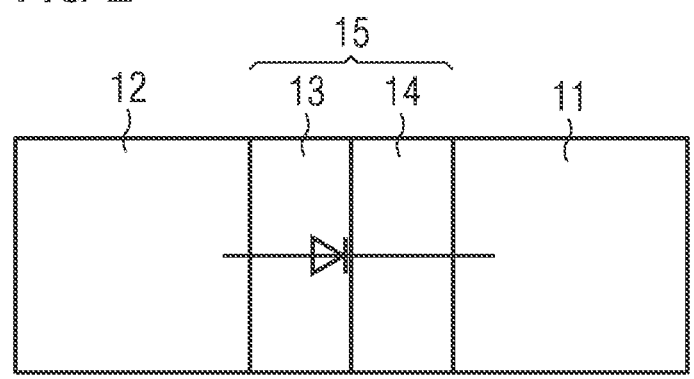
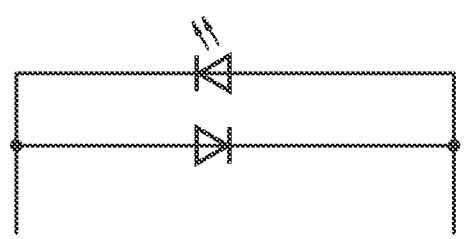

OPTOELECTRONIC SEMICONDUCTOR COMPONENT

The application relates to an optoelectronic semiconductor device comprising a semiconductor body and a carrier of a plastics material.

CROSS-REFERENCE OF RELATED APPLICATIONS

This patent application is the U.S. National Phase under 35 U.S.C. § 371 of International Patent Application No. PCT/EP2016/065714, filed on Jul. 4, 2016, which in turn claims priority from German patent application 10 2015 111 485.2, filed on Jul. 15, 2015, the disclosure content of which is hereby included by reference.

The optoelectronic semiconductor device may in particular comprise a semiconductor body and a plastics carrier produced using a molding method, which is provided with through-vias for electrical contacting of the semiconductor body.

One object to be achieved consists in providing an improved optoelectronic semiconductor device, which is distinguished by low sensitivity to short circuits and/or electrostatic discharges (ESD) and is comparatively simple to produce.

This object is achieved by an optoelectronic semiconductor device according to independent claim 1. Advantageous configurations and further developments of the invention are the subject matter of the dependent claims.

According to one embodiment, the optoelectronic semiconductor device comprises a semiconductor body which comprises a semiconductor layer sequence with a p-type semiconductor region, an n-type semiconductor region and an active layer arranged between the p-type semiconductor region and the n-type semiconductor region. The active layer may in particular be a radiation-emitting active layer. The p-type semiconductor region, the n-type semiconductor region and the active layer may each comprise one or more semiconductor layers. The p-type semiconductor region contains one or more p-doped semiconductor layers and the n-doped semiconductor region one or more n-doped semiconductor layers. It is also possible for the p-type semiconductor region and/or the n-type semiconductor region to contain one or more undoped semiconductor layers.

The active layer may for example take the form of a pn-junction, of a double heterostructure, of a single quantum well structure or of a multiple quantum well structure. The term "quantum well structure" here includes any structure in which charge carriers undergo quantization of their energy states by inclusion ("confinement"). In particular, the term quantum well structure does not provide any indication of the dimensionality of the quantization. It thus encompasses inter alia quantum wells, quantum wires and quantum dots and any combination of these structures.

Furthermore, the optoelectronic semiconductor device comprises a carrier comprising a plastics material. The carrier may in particular be produced using a molding method. In other words, the carrier is a "molded body". The term molding method here covers all production methods in which a molding composition is introduced into a predetermined mold and in particular is subsequently cured. In particular, the term molding method encompasses casting (potting), injection molding, transfer molding and compression molding. The carrier is preferably formed by compression molding or by film assisted transfer molding.

The plastics material of the carrier preferably comprises a molding resin, such as for example an epoxy resin, or a silicone. The plastics material may contain one or more additives as admixtures. The carrier may for example comprise $SiO_2$ particles for adjusting the coefficient of thermal expansion. The carrier may for example have a thickness of between 50 μm and 500 μm, preferably of between 100 μm and 200 μm, typically of around 150 μm.

According to at least one embodiment, the carrier comprises a first through-via and a second through-via, each of which pass from a first main surface of the carrier facing the semiconductor body to a second main surface of the carrier remote from the semiconductor body.

Because the through-vias pass from the first main surface of the carrier to the opposing second main surface of the carrier, the optoelectronic device may advantageously be provided with electrical connections at the second main surface of the carrier. In particular, the optoelectronic device may be connected at the second main surface of the carrier with conductor tracks of a printed circuit board, for example by connecting the first through-via with a solder layer with a first conductor track of a printed circuit board and the second through-via with a second solder layer with a second conductor track of the printed circuit board. The optoelectronic device is thus advantageously surface-mountable.

Furthermore, the optoelectronic semiconductor device advantageously comprises a p-connection layer and an n-connection layer, which are arranged at least in places between the carrier and the semiconductor body, wherein the p-connection layer connects the first through-via with the p-type semiconductor region and the n-connection layer connects the second through-via with the n-type semiconductor region. The first and second electrical contact layers are insulated from one another by an electrically insulating layer. Advantageously, in the case of the optoelectronic semiconductor chip both the p-type semiconductor region and the n-type semiconductor region are contacted from the carrier side. This has the advantage that a radiation exit face of the semiconductor body opposite the carrier may be free of connection layers. This advantageously increases radiant yield.

In one preferred embodiment the n-connection layer is passed through an opening in the p-type semiconductor region and the active layer into the n-type semiconductor region. In the region of the opening, the n-connection layer is isolated from the active layer and the p-type semiconductor region by an electrically insulating layer.

It is furthermore advantageous for the n-connection layer and/or the p-connection layer to be reflective for the radiation emitted by the active layer, in order to reflect radiation emitted in the direction of the carrier towards the radiation exit face. The n-connection layer and/or the p-connection layer may in particular comprise a reflective metal layer and preferably contain silver or aluminum. It is possible for the n-connection layer and/or the p-connection layer to comprise multiple sublayers, in particular a metal layer and a layer of a transparent conductive oxide such as for example ITO or doped ZnO, wherein the dopant may for example be Al or Ga.

Furthermore, the optoelectronic semiconductor device advantageously contains an ESD protective element, which is arranged between the carrier and the semiconductor body.

The ESD protective element is electrically conductively connected with the first through-via and the second through-via, wherein a conducting direction of the ESD protective element is antiparallel to a conducting direction of the semiconductor layer sequence. The ESD protective element exhibits direction-dependent electrical conductivity, wherein the conducting direction is the direction with the greater electrical conductivity. In other words, the ESD protective element comprises a higher conductivity in the reverse direction of the semiconductor layer sequence and has a lower conductivity in the forward direction of the semiconductor layer sequence or is preferably non-conductive. The ESD protective element in this way advantageously protects the semiconductor layer sequence from high voltages in the non-conducting direction of the semiconductor layer sequence which in particular occur as a result of electrostatic discharge and could lead to damage to the optoelectronic semiconductor device.

The ESD protective element is preferably a planar layer which has been integrated into the optoelectronic semiconductor device. In other words, the ESD protective element is in particular not a separately manufactured component and does not have a package. The ESD protective element may for example take the form of a diode, a Schottky contact or a varistor. The ESD protective element may for example comprise or consist of at least one of the materials ZnO, Si, TiO, ITO, SnO, Ge, Se, Te, AlN or graphene. The material of the ESD protective element may be provided at least in places with an n-dopant or a p-dopant, for example to form a diode.

In one preferred configuration, the ESD protective element is arranged at a boundary surface of the carrier facing the semiconductor body. As a result of being arranged between the semiconductor body and the carrier, the ESD protective element is advantageously protected from external influences by the plastics material of the carrier and is preferably not visible from the outside.

The ESD protective element may in particular directly adjoin the first and second through-vias of the carrier. The ESD protective element may for example be applied to a face of the optoelectronic semiconductor device facing the carrier, before the through-vias and the carrier are produced. For example, the ESD protective element is produced first, then the through-vias are produced, for example by electroplating, and in a further step the carrier is produced by a molding method.

In one preferred configuration, the ESD protective element is a diode which comprises an n-conductive region and a p-conductive region. In this case, the n-conductive region is electrically conductively connected with the first through-via and the p-conductive region with the second through-via. Preferably, the n-conductive region directly adjoins the first through-via and the p-conductive region directly adjoins the second through-via.

In one preferred configuration, the n-conductive region and the p-conductive region are each of annular configuration. The n-conductive region may for example be arranged annularly around the first through-via, wherein the p-conductive region is arranged annularly around the n-conductive region. In this configuration, the n-connection layer or the second through-via may annularly surround the p-conductive region.

It is alternatively also possible for the p-conductive region to be arranged annularly around the second through-via, wherein the n-conductive region annularly surrounds the p-conductive region. In this configuration, the n-connection layer or the first through-via may annularly surround the n-conductive region.

The annular configuration of the p-conductive region and the n-conductive region of the ESD protective element has the advantage that the pn junction has a comparatively large area. In this way, a high current-carrying capacity and thus particularly good ESD protection are achieved in the event of voltage pulses in the non-conducting direction of the semiconductor layer sequence.

Figure 4:
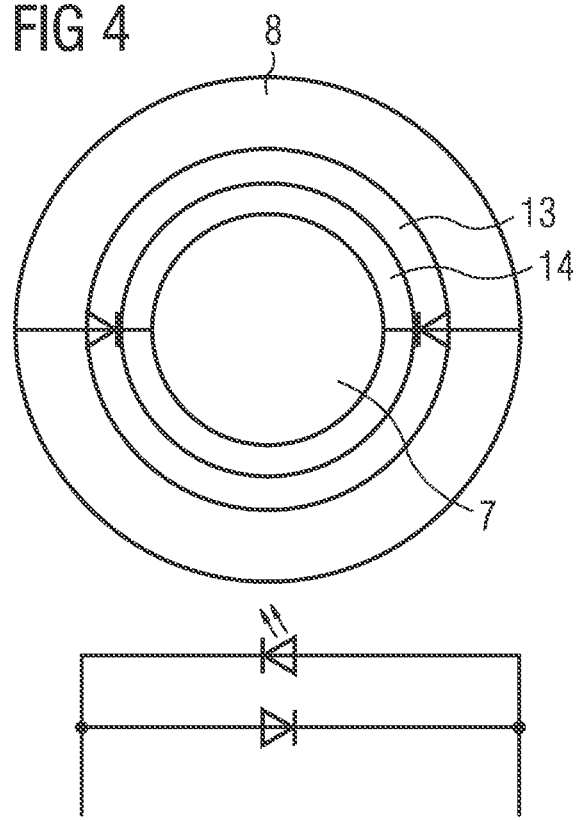

The invention is explained in greater detail below with reference to exemplary embodiments in conjunction with FIGS. 1 to 4, in which:

FIG. 1 is a schematic representation of a cross-section through an optoelectronic semiconductor device according to a first exemplary embodiment, FIG. 2 is a schematic representation of a plan view onto the arrangement of the ESD protective element between the first and second through-vias, in the first exemplary embodiment, FIG. 3 is a schematic representation of a cross-section through an optoelectronic semiconductor device according to a second exemplary embodiment, FIG. 4 is a schematic representation of a plan view onto the arrangement of the ESD protective element between the first and second through-vias, in the second exemplary embodiment.

The components illustrated in the figures and the size ratios of the components to one another should not be regarded as to scale.

The exemplary embodiment of an optoelectronic semiconductor device shown in FIG. 1 comprises an LED. The LED comprises a semiconductor body 1 which comprises a semiconductor layer sequence 2 with an active layer 4 suitable for emitting radiation. The active layer 4 may for example comprise a pn junction or a single or multiple quantum well structure for generating radiation. The active layer 4 is arranged between a p-type semiconductor region 3 and an n-type semiconductor region 5.

The semiconductor layer sequence 2 is preferably based on a III-V compound semiconductor material, in particular on an arsenide, nitride or phosphide compound semiconductor material. For example the semiconductor layer sequence 2 may contain $In_xAl_yGa_{1-x-y}N$, $In_xAl_yGa_{1-x-y}P$ or $In_xAl_yGa_{1-x-y}As$, in each case with $0 \le x \le 1$, $0 \le y \le 1$ and $x+y \le 1$. In this case, the III-V compound semiconductor material does not absolutely have to comprise a mathematically exact composition according to one of the above formulae. Instead, it may comprise one or more dopants and additional constituents which do not substantially modify the physical characteristics of the material. For simplicity's sake, however, the above formulae include only the fundamental constituents of the crystal lattice, even if these may in part be replaced by small quantities of further substances.

The LED according to the exemplary embodiment comprises a thin-film LED, from which a growth substrate used to grow the semiconductor layer sequence 2 has been subsequently detached from the semiconductor layer sequence 2. The original growth substrate, for example a sapphire, silicon or GaAs substrate, has been detached from the side of the semiconductor body 1 on which the radiation exit face 16 is now located. The semiconductor body 1 may be roughened on its radiation exit face 16 or provided with patterning in order to improve radiation outcoupling from the semiconductor body 1. Patterning or roughening of the semiconductor body 1 on the radiation exit face 16 may proceed in particular using an etching process.

The semiconductor body 1 is connected with a carrier 10 on an opposite surface from the radiation exit face 16. The carrier 10 is formed from a plastics material. The carrier 10 may in particular be produced by means of compression molding, transfer molding or another molding method. The plastics material of the carrier 10 may for example comprise an epoxy resin or a silicone.

The carrier 10 comprises a first main surface 17 facing the semiconductor body 1 and a second main surface 18 remote from the semiconductor body. The carrier 10 comprises a first through-via 11 and a second through-via 12, which each pass from the first main surface 17 to the second main surface 18 of the carrier 10. The through-vias 11, 12 advantageously comprise a metal or a metal alloy and may in particular be produced by electroplating. The through-vias 11, 12 may for example contain Cu, Ni or a solder.

The two through-vias 11, 12 serve in electrical contacting of the semiconductor body 1. For example, the first through-via 11 is electrically conductively connected with the p-type semiconductor region 3 of the semiconductor layer sequence 2 and the second through-via 12 with the n-type semiconductor region 5.

An electrically conductive connection between the first through-via 11 and the p-type semiconductor region 3 is achieved in particular by means of a p-connection layer 7, which is arranged between the semiconductor body 1 and the carrier 10. In the exemplary embodiment, the p-connection layer 7 does not directly adjoin the p-type semiconductor region 3. Rather, an electrically conductive mirror layer 6 is arranged between the p-type semiconductor region 3 and the p-connection layer 7 and deflects radiation emitted by the active layer 4 in the direction of the carrier 10 towards the radiation exit face 16. The mirror layer 6 preferably contains a silver layer. The mirror layer 6 may also comprise multiple sublayers, in particular a metal layer and a layer of a transparent conductive oxide such as for example ITO or ZnO.

The second through-via 12 is electrically conductively connected by means of an n-connection layer 8, 8A with the n-type semiconductor region 5. This may proceed for example in such a way that part of the n-connection layer 8 is passed through an opening through the semiconductor layer sequence 2 as far as into the n-type semiconductor region 5 and in this way forms a through-contact 8A. The n-connection layer 8, 8A is electrically insulated by one or more electrically insulating layers 9 from the p-type semiconductor region 3, the active layer 4, the p-connection layer 7 and the first through-via 11. The at least one electrically insulating layer 9 may for example comprise a silicon oxide or aluminum oxide.

Contacting of the optoelectronic device by means of the n-connection layer 8, 8A passed through the active zone 4 has the advantage that contacting of both the n-type semiconductor region 5 and the p-type semiconductor region 3 proceeds from the side of the semiconductor body 1 facing the carrier 10. The radiation exit face 16 of the optoelectronic device is therefore advantageously free of electrical contact elements such as for example bond pads, contact metallization or connection wires. This prevents the absorption of radiation by contact elements at the radiation exit face 16.

At the second main surface 18 of the carrier 10 opposite the semiconductor body 1 the through-vias 11, 12 may advantageously be externally connected. In particular, at the second main surface 18 of the carrier 10 the electrically conductive through-vias 11, 12 may for example be connected with conductor tracks. The optoelectronic semiconductor device is thus advantageously surface-mountable.

In the optoelectronic semiconductor device an ESD protective element 15 is advantageously arranged between the carrier 10 and the semiconductor layer sequence 2. The ESD protective element 15 exhibits direction-dependent conductivity and is connected antiparallel to a conducting direction of the semiconductor layer sequence 2. In particular, the ESD protective element 15 has a lower conductivity in the forward direction of the semiconductor layer sequence 2 than in the reverse direction of the semiconductor layer sequence 2.

In the exemplary embodiment the ESD protective element 15 takes the form of a diode, which comprises a p-conductive region 13 and an n-conductive region 14. In this case, the n-conductive region 14 adjoins the first through-via 11, which is electrically conductively connected with the p-type semiconductor region 3 of the semiconductor layer sequence 2. The p-conductive region 13 adjoins the second through-via 12, which is electrically conductively connected with the n-type semiconductor region 5. The pn junction of the ESD protective element 15 is thus connected antiparallel to the semiconductor layer sequence 2. In the event of ESD voltage pulses in the non-conducting direction of the semiconductor layer sequence 2, the resultant current may therefore be bled off via the pn junction of the ESD protective element 15. In this way, damage to the semiconductor layer sequence 2 by electrostatic discharge is advantageously prevented.

As an alternative to configuration as a diode, the ESD protective element 15 may also be configured as a Schottky contact or as a varistor.

The ESD protective element 15 is advantageously arranged on a first main surface 17 of the carrier 10 facing the semiconductor layer sequence 2. In particular, the ESD protective element 15 may directly adjoin the carrier 10, wherein the p-conductive region 13 directly adjoins the second through-via 12 and the n-conductive region 14 directly adjoins the first through-via 11. The ESD protective element may directly adjoin the plastics material of the carrier 10 at least in places. The ESD protective element 15 is thus arranged inside the optoelectronic semiconductor device and in this way is protected from external influences.

As is clear from FIG. 2 in a schematically depicted plan view onto the ESD protective element 15, in the exemplary embodiment of FIG. 1 the ESD protective element 15 forms a linear connection between the first through-via 11 and the second through-via 12. The circuit diagram depicted schematically below the plan view makes clear that the ESD protective element is connected antiparallel to the light-emitting semiconductor layer sequence.

A further exemplary embodiment is shown in cross-section and in a schematically depicted plan view onto the ESD protective element 15 in FIGS. 3 and 4. As in the first exemplary embodiment, the ESD protective element 15 is a diode, which comprises an n-conductive region 14 and a p-conductive region 13. Unlike in the first exemplary embodiment, the ESD protective element 15 is not formed directly at the boundary surface with the carrier 10 but rather in a region between the p-connection layer 7 and the n-connection layer 8.

As is clear from the plan view in FIG. 4, the n-conductive region 14 and the p-conductive region 13 are each of annular configuration. The n-conductive region 14 is electrically conductively connected with the p-connection layer 7 and may in particular directly adjoin the p-connection layer 7. In this way, the n-conductive region 14 is indirectly electrically conductively connected with the first through-via 11 and the p-type semiconductor region 3 of the semiconductor layer sequence 2. The n-conductive region 14 in particular passes annularly around the p-connection layer 7.

The p-conductive region 13 passes annularly around the n-conductive region 14, which is electrically conductively connected with the n-connection layer 8 and may in particular directly adjoin the n-connection layer 8. In this way, the p-conductive region 13 is indirectly electrically conductively connected with the second through-via 12 and the n-type semiconductor region 5 of the semiconductor layer sequence 2. The circuit diagram depicted schematically below the plan view makes clear that the ESD protective element 15 is connected antiparallel to a conducting direction of the light-emitting semiconductor layer sequence 2.

The annular configuration of the p-conductive region 13 and of the n-conductive region 14 has the advantage that the pn junction of the ESD protective element 15 has a comparatively large area compared with a linear arrangement of the p-conductive region 13 and the n-conductive region 14. This results in considerable current-carrying capacity in the non-conducting direction of the optoelectronic semiconductor device 1 and thus particularly good ESD protection.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 semiconductor body
2 semiconductor layer sequence
3 p-doped semiconductor region
4 active layer
5 n-doped semiconductor region
6 mirror layer
7 p-connection layer
8 n-connection layer
9 electrically insulating layer
10 carrier
11 first through-via
12 second through-via
13 p-conductive region
14 n-conductive region
15 ESD protective element
16 radiation exit face
17 first main surface
18 second main surface

The invention claimed is:

1. Optoelectronic semiconductor device with
a semiconductor body which comprises a semiconductor layer sequence with a p-type semiconductor region, an n-type semiconductor region and an active layer arranged between the p-type semiconductor region and the n-type semiconductor region,
a carrier, which comprises a plastics material and comprises a first through-via and a second through-via,
a p-connection layer and an n-connection layer, which are arranged at least in places between the carrier and the semiconductor body, wherein the p-connection layer connects the first through-via with the p-type semiconductor region and the n-connection layer connects the second through-via with the n-type semiconductor region,
an ESD protective element, which is arranged between the carrier and the semiconductor body, wherein the ESD protective element is electrically conductively connected with the first through-via and the second through-via, and wherein a conducting direction of the ESD protective element is antiparallel to a conducting direction of the semiconductor layer sequence, and wherein the ESD protective element directly adjoins the first through-via and the second through-via.

2. Optoelectronic semiconductor device according to claim 1, wherein the ESD protective element takes the form of a planar layer.

3. Optoelectronic semiconductor device according to claim 1, wherein the ESD protective element takes the form of a diode, Schottky contact or varistor.

4. Optoelectronic semiconductor device according to claim 1, wherein the ESD protective element comprises at least one of the materials ZnO, Si, TiO, ITO, SnO, Ge, Se, Te, AlN or graphene.

5. Optoelectronic semiconductor device according to claim 1, wherein the ESD protective element is arranged at a boundary surface of the carrier facing the semiconductor body.

6. Optoelectronic semiconductor device according to claim 1, wherein the ESD protective element is a diode, which comprises a p-conductive region and an n-conductive region, wherein the n-conductive region is electrically conductively connected with the first through-via and the p-conductive region is electrically conductively connected with the second through-via.

7. Optoelectronic semiconductor device according to claim 6, wherein the p-conductive region and the n-conductive region form a linear connection between the first through-via and the second through-via.

8. Optoelectronic semiconductor device according to claim 1, wherein the carrier comprises an epoxy resin or a silicone.

9. Optoelectronic semiconductor device according to claim 1, wherein the n-connection layer is passed through an opening in the p-type-semiconductor region and the active layer into the n-type semiconductor region.

* * * * *